(12) United States Patent
Huang et al.

(10) Patent No.: US 11,683,888 B2
(45) Date of Patent: Jun. 20, 2023

(54) METHOD FOR MANUFACTURING A PACKAGED CIRCUIT STRUCTURE

(71) Applicants: Leading Interconnect Semiconductor Technology Qinhuangdao Co., Ltd., Qinhuangdao (CN); Qi Ding Technology Qinhuangdao Co., Ltd., Qinhuangdao (CN); Leading Interconnect Semiconductor Technology (ShenZhen) Co., Ltd., Shenzhen (CN)

(72) Inventors: Chun-Chieh Huang, Taoyuan (TW); Chin-Ming Liu, Taoyuan (TW)

(73) Assignees: Leading Interconnect Semiconductor Technology Qinhuangdao Co, Ltd., Qinhuangdao (CN); Qi Ding Technology Qinhuangdao Co, Ltd., Qinhuangdao (CN); Leading Interconnect Semiconductor Technology (ShenZhen) Co, Ltd., Shenzhen (CN)

( * ) Notice: Subject to any disclaimer, the term of this patent is extended or adjusted under 35 U.S.C. 154(b) by 15 days.

(21) Appl. No.: 17/218,556

(22) Filed: Mar. 31, 2021

(65) Prior Publication Data
US 2022/0240385 A1    Jul. 28, 2022

(30) Foreign Application Priority Data
Jan. 25, 2021 (CN) .......................... 202110097582.X

(51) Int. Cl.
*H05K 3/46* (2006.01)
*H05K 1/18* (2006.01)
*H05K 3/28* (2006.01)

(52) U.S. Cl.
CPC ............ *H05K 1/186* (2013.01); *H05K 3/284* (2013.01); *H05K 3/4697* (2013.01); *H05K 2203/308* (2013.01)

(58) Field of Classification Search
CPC ...... H05K 1/186; H05K 3/284; H05K 3/4697; H05K 2203/308; H05K 1/183; Y02P 70/50
See application file for complete search history.

(56) References Cited

U.S. PATENT DOCUMENTS 9,024,203 B2 * 5/2015 Lai .................. H05K 1/184 174/259
9,627,309 B2 * 4/2017 Kobayashi .......... H05K 3/4682
(Continued)

FOREIGN PATENT DOCUMENTS

JP    2016-76509 A    5/2016
TW       332962      6/1998

*Primary Examiner* — Donghai D Nguyen
(74) *Attorney, Agent, or Firm* — ScienBiziP, P.C.

(57) ABSTRACT

A package circuit structure includes a multilayer circuit board, an electronic component, and an insulating layer. The multilayer circuit board includes a metal portion and an opening. The opening is extending from a first side of the multilayer circuit board toward the second side of the multilayer circuit board facing the first side. A bottom of the opening is sealed by the metal portion. The electronic component is received in the opening and adhered to the metal portion. The electronic component is electrically connected to the multilayer circuit board and encapsulated in the opening by the insulating layer. A method for manufacturing the package circuit structure is also provided.

11 Claims, 11 Drawing Sheets

(56) References Cited

U.S. PATENT DOCUMENTS 10,103,113 B2 * 10/2018 Ko .................... H05K 3/429
2015/0327362 A1 * 11/2015 Maeda ................ H05K 3/4682
29/832

* cited by examiner

METHOD FOR MANUFACTURING A PACKAGED CIRCUIT STRUCTURE

FIELD

The subject matter herein generally relates to a circuit board and a method for manufacturing the circuit board, particularly relates to a package circuit structure and a method for manufacturing the package circuit structure.

BACKGROUND

With the development of the electronic products, sizes of the electronic products are becoming smaller. As an important element in the electronic products, size of the circuit board need to be smaller.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
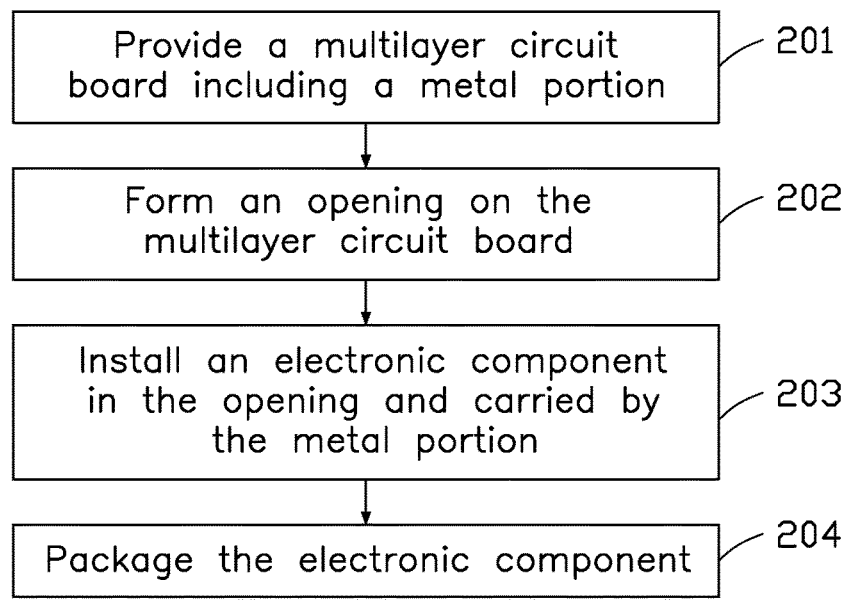
FIG. 1 is a flowchart of an embodiment of a method for manufacturing a package circuit structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with an embodiment. The method for manufacturing a package circuit structure is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 201.

Figure 2:
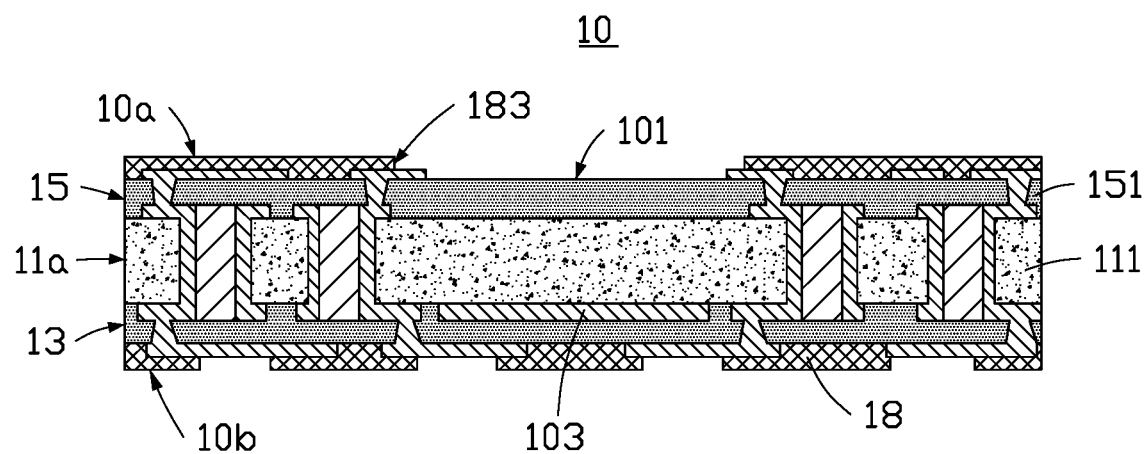
FIG. 2 is a diagrammatic view of an embodiment of a multilayer circuit board.

At block 201, referring to FIG. 2, a multilayer circuit board 10 is provided. The multilayer circuit board 10 includes an opening area 101 extending from a first side 10a of the multilayer circuit board 10 to a second side 10b facing away from the first side 10a along a thickness direction. The multilayer circuit board 10 further includes a metal portion 103 corresponding to a bottom of the opening area 101 to support the opening area 101.

In at least one embodiment, no wiring is provided in the opening area 101. The multilayer circuit board 10 further includes two solder masks 18 on opposite sides of the multilayer circuit board 10 along the thickness direction. The opening area 101 is exposed from the solder mask 18 on the first side 10a.

Figure 3:
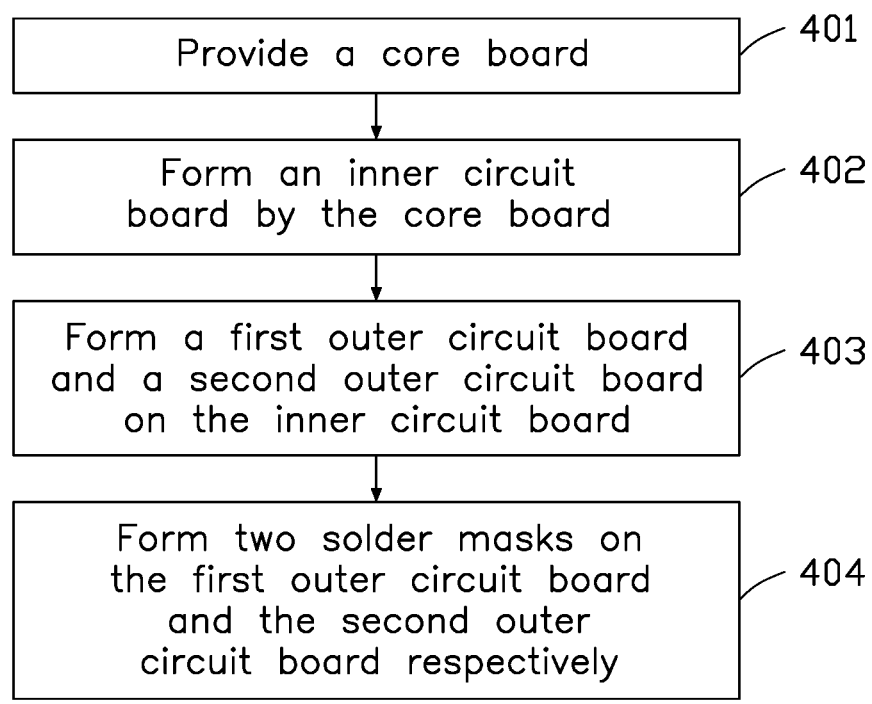
FIG. 3 is a flowchart of an embodiment of a method for manufacturing a multilayer circuit board.

In at least one embodiment, the multilayer circuit board 10 may be a circuit board with four wiring layers. FIG. 3 illustrates a flowchart of an embodiment of a method for manufacturing the multilayer circuit board 10. The method can begin at block 401.

Figure 4:
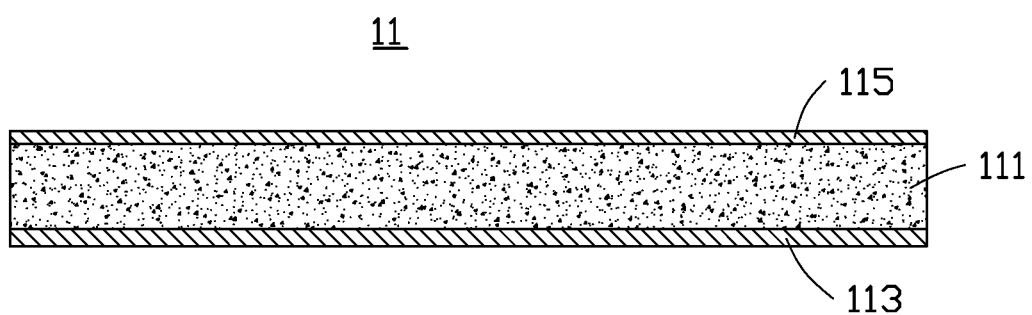
FIG. 4 is a diagrammatic view of an embodiment of a core board.

At block 401, referring to FIG. 4, a core board 11 is provided. The core board 11 includes a first metal foil 113, an inner dielectric layer 111, and a second metal foil 115 stacked in that order along a thickness direction.

Figure 5:
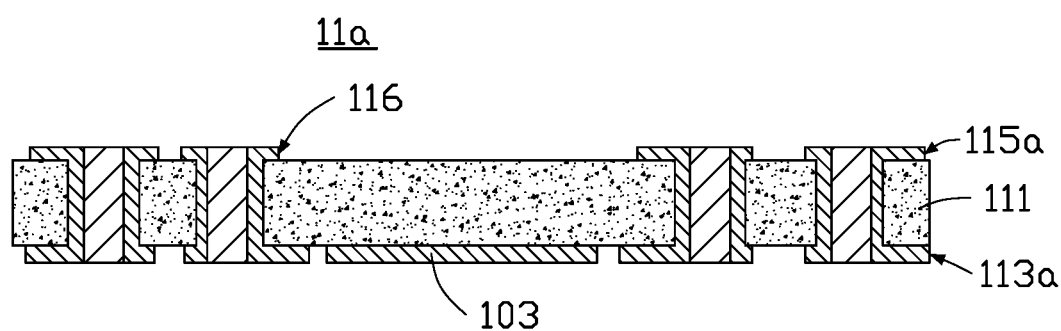
FIG. 5 is a diagrammatic view of an embodiment of an inner circuit board formed by the core board of FIG. 4.

At block 402, referring to FIG. 5, an inner circuit board 11a is formed by performing a circuit manufacturing technology on the core board 11. The first metal foil 113 correspondingly forms a first inner wiring layer 113a, the second metal foil 115 correspondingly forms a second inner wiring layer 115a. The first inner wiring layer 113a is electrically connected to the second inner wiring layer 115a. The first inner wiring layer 113a includes a metal portion 103.

In at least one embodiment, the second inner wiring layer 115a may include a first gap 116 corresponding to the metal portion 103. Preferably, a size of the first gap 116 may be greater than a size of the metal portion 103, so that an orthographic projection of the metal portion 103 on the second inner wiring layer 115a is located in the first gap 116.

Figure 6:
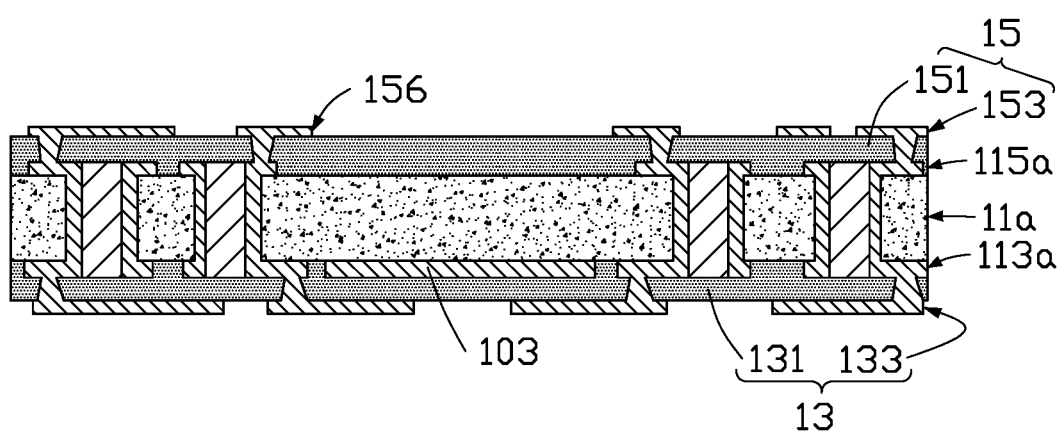
FIG. 6 is a cross-sectional view showing a first outer circuit board and a second outer circuit board on the inner circuit board of FIG. 5.

At block 403, referring to FIG. 6, a first outer circuit board 13 is built-up on the first inner wiring layer 113a, and a second outer circuit board 15 is built-up on the second inner wiring layer 115a. The first outer circuit board 13 includes a first outer dielectric layer 131 combined with the first inner wiring layer 113a and a first outer wiring layer 133 formed on a side of the first outer dielectric layer 131 facing away from the inner circuit board 11a. The second outer circuit board 15 includes a second outer dielectric layer 151 combined with the second inner wiring layer 115a and a second outer wiring layer 153 formed on a side of the second outer dielectric layer 151 facing away from the inner circuit board 11a.

In at least one embodiment, the second outer wiring layer 153 may include a second gap 156 corresponding to the metal portion 103. Preferably, a size of the second gap 156 may be greater than the size of the metal portion 103, so that an orthographic projection of the metal portion 103 on the second outer wiring layer 153 is located in the second gap 156.

The first outer circuit board 13 and the second outer circuit board 15 may be electrically connected to the inner circuit board 11a, respectively.

At block 404, referring to FIG. 2, two solder masks 18 are formed on a side of the first outer circuit board 13 facing away from the inner circuit board 11a and a side of the second outer circuit board 15 facing away from the inner circuit board 11a, respectively.

In at least one embodiment, the solder mask 18 on the side of the second outer circuit board 15 facing away from the inner circuit board 11a may include a third gap 183 corresponding to the metal portion 103. Preferably, a size of the third gap 183 may be greater than the size of the metal portion 103, so that an orthographic projection of the metal portion 103 on the solder mask 18 on the side of the second outer circuit board 15 facing away from the inner circuit board 11a is located in the third gap 183.

In at least one embodiment, a portion of the second outer dielectric layer 151 corresponding to the metal portion 103 and a portion of the inner dielectric layer 111 corresponding to the metal portion 103 constitute the opening area 101.

Figure 7:
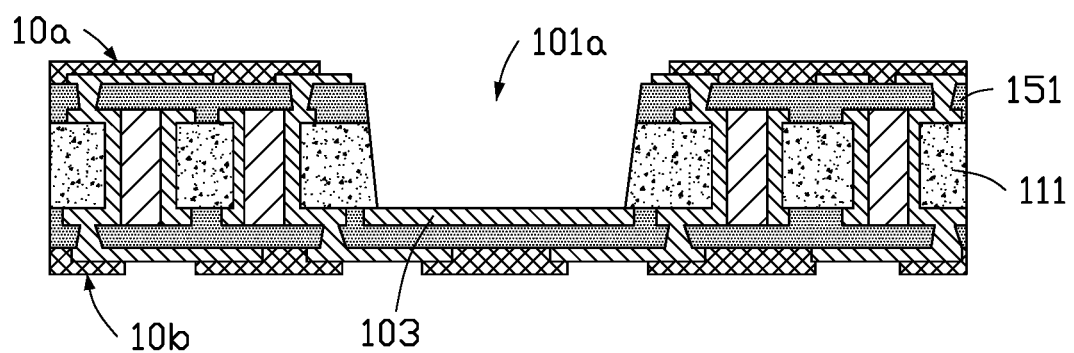
FIG. 7 is a cross-sectional view showing an opening formed on the multilayer circuit board of FIG. 2.

At block 202, referring to FIG. 7, the opening area 101 is removed to form an opening 101a. The metal portion 103 seals the bottom of the opening 101a.

Preferably, a width of the opening 101a may gradually decrease from the first side 10a toward the second side 10b, so that the metal portion 103 is beneficial to seal the bottom of the opening 101a. In at least one embodiment, the width of the opening 101a may be the same from the first side 10a toward the second side 10b.

In at least one embodiment, the opening 101a may be formed by mechanical cutting, laser cutting, plasma cutting or sandblasting.

Figure 8:
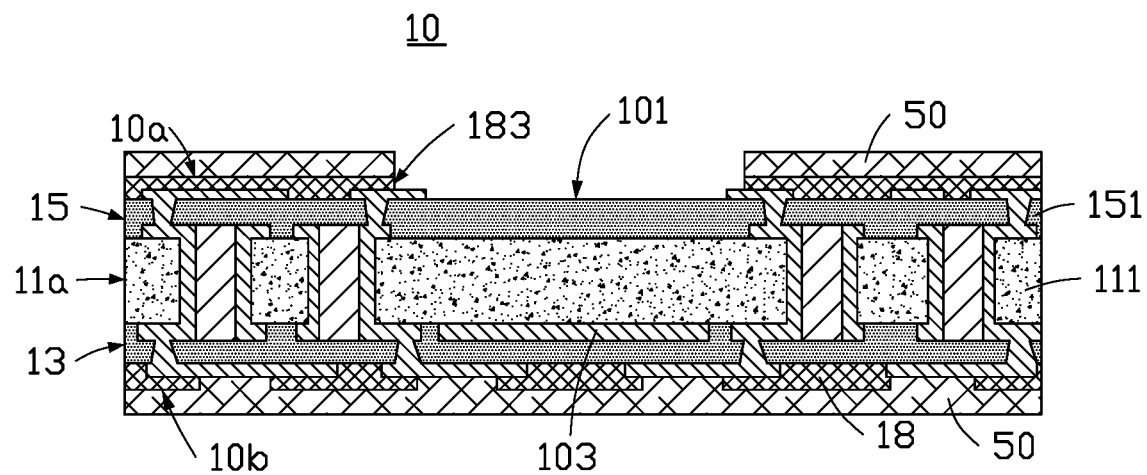
FIG. 8 is a cross-sectional view showing two protective films on opposite sides of the multilayer circuit board of FIG. 2.

In at least one embodiment, before removing the opening area 101, two protective films 50 (shown in FIG. 8) may be formed on the first side 10a and the second side 10b of the multilayer circuit board 10. The opening area 101 is exposed from the protective film on the first side 10a. The protective films 50 may reduce a risk of damage to other areas of the multilayer circuit board 10 when the opening area 101 is removed. After removing the opening area 101 to form the opening 101a, the protective films 50 are removed.

In at least one embodiment, the portion of the second outer dielectric layer 151 corresponding to the metal portion 103 and the portion of the inner dielectric layer 111 corresponding to the metal portion 103 are removed, thereby forming the opening 101a.

When no wiring or no solder mask is provided in the opening area 101, a difference in materials when the opening area 101 is removed is reduced, which is beneficial to the formation of the opening 101a. At the same time, the opening area 101 is supported by the metal portion 103, which is beneficial to determine the cutting depth when the opening area 101 is removed.

Figure 9:
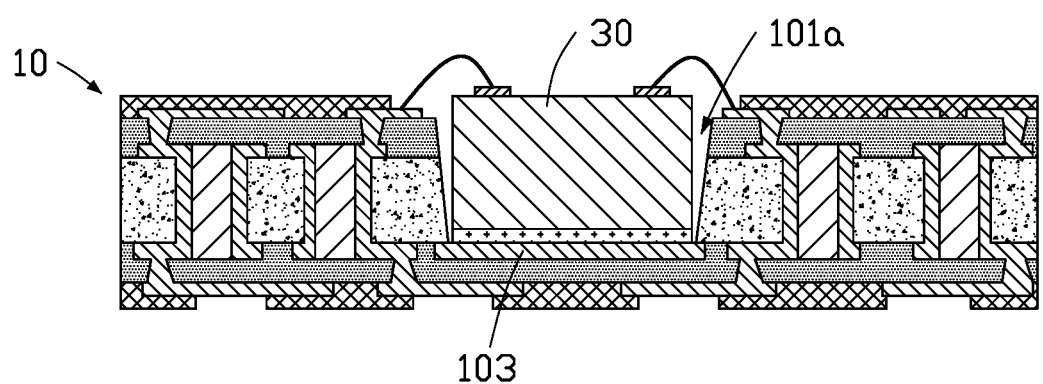
FIG. 9 is a cross-sectional view showing an electronic component installed in the opening of FIG. 7.

At block 203, referring to FIG. 9, an electronic component 30 is installed in the opening 101a and carried by the metal portion 103. The electronic component 30 is electrically connected to the multilayer circuit board 10.

The electronic component 30 is carried by the metal portion 103, which is beneficial to improve a bearing strength and also facilitate an adhesion of the electronic component 30 to the multilayer circuit board 10.

Figure 10:
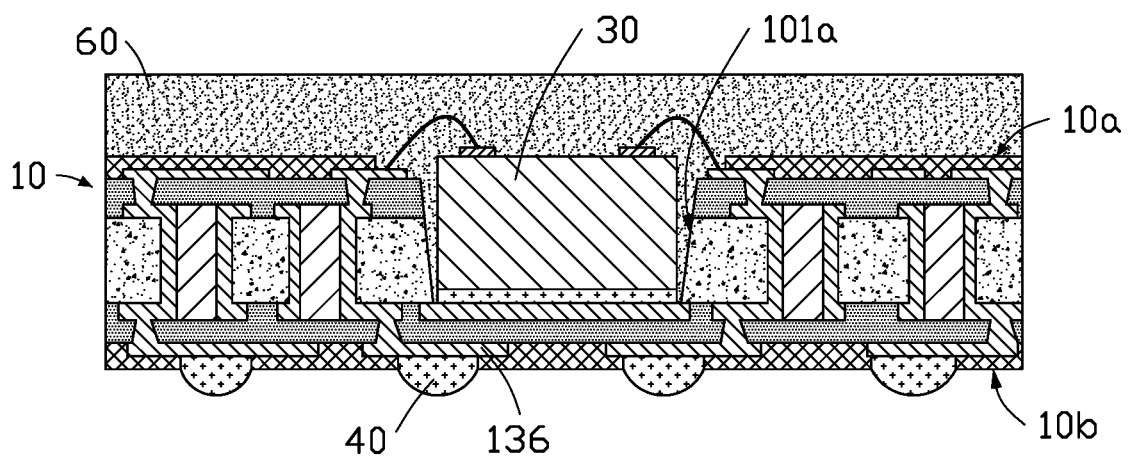
FIG. 10 is a cross-sectional view showing the electronic component of FIG. 9 packaged.

At block 204, referring to FIG. 10, the electronic component 30 is packaged.

In at least one embodiment, an insulating layer 60 is formed on the first side 10a of the multilayer circuit board 10. The insulating layer 60 fills the opening 101a and covers the electronic component 30, thereby encapsulating the electronic component 30.

The insulating layer 60 may be formed by injection molding.

In at least one embodiment, a plurality of connecting pads 136 is formed on the second side 10b of the multilayer circuit board 10. The block 204 may further include forming a solder ball 40 on each connecting pad 136 for electrically connection with other components.

Depending on the embodiment, certain of the steps of methods described may be removed, others may be added, and the sequence of steps may be altered. It is also to be understood that the description and the claims drawn to a method may include some indication in reference to sequential steps. However, the indication used is only to be viewed for identification purposes and not as a suggestion as to an order for the steps.

Figure 11:
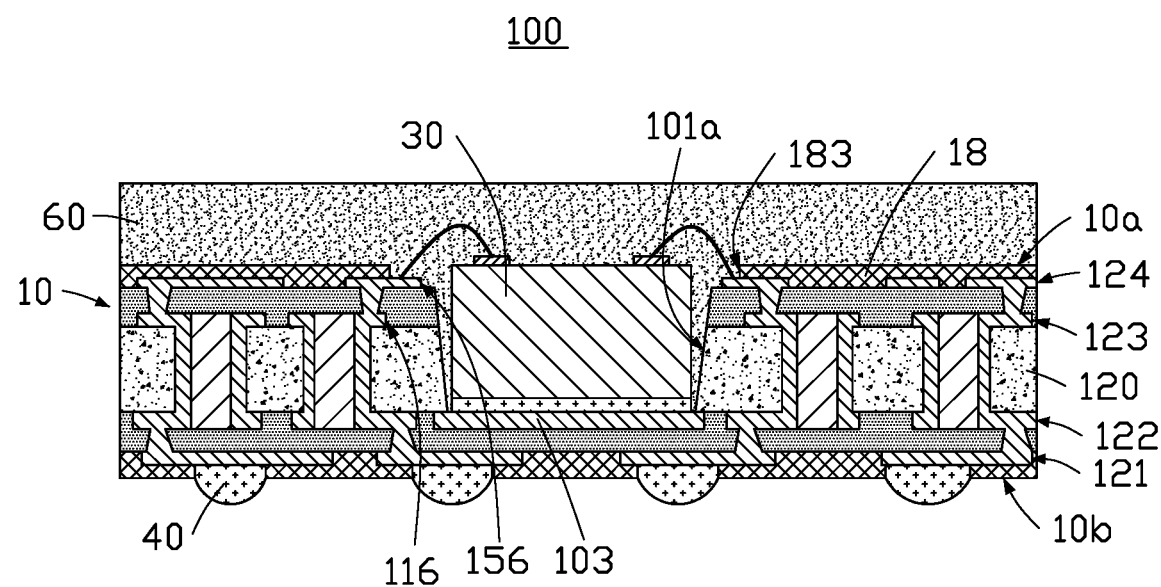
FIG. 11 is a diagrammatic view of an embodiment of a package circuit structure.

FIG. 11 illustrates an embodiment of a package circuit structure 100. The package circuit structure 100 includes a multilayer circuit board 10, an electronic component 30, and an insulating layer 60. The multilayer circuit board 10 includes a metal portion 103 and an opening 101a. The opening 101a is extending from a first side 10a of the multilayer circuit board 10 toward the second side 10b of the multilayer circuit board 10 facing the first side 10a. A bottom of the opening 101a is sealed by the metal portion 103. The electronic component 30 is received in the opening 101a and adhered to the metal portion 103. The electronic component 30 is electrically connected to the multilayer circuit board 10 and encapsulated in the opening 101a by the insulating layer 60.

In at least one embodiment, a width of the opening 101a may gradually decrease from the first side 10a toward the second side 10b, so that the metal portion 103 is beneficial to seal the bottom of the opening 101a. In at least one embodiment, the width of the opening 101a may be the same from the first side 10a toward the second side 10b.

The package circuit structure 100 may further include a plurality of solder balls 40. Each solder ball 40 is formed on the second side 10b of the multilayer circuit board 10 and electrically connected to the multilayer circuit board 10.

In at least one embodiment, the insulating layer 60 is formed on the first side 10a of the multilayer circuit board 10, fills in the opening 101a, and covers the electronic component 30.

In at least one embodiment, the multilayer circuit board 10 may be a circuit board with four wiring layers. The multilayer circuit board 10 may include a dielectric layer 120, a first wiring layer 121, a second wiring layer 122, a third wiring layer 123, and a fourth wiring layer 124. The first wiring layer 121, the second wiring layer 122, the third wiring layer 123, and the fourth wiring layer 124 are stacked in that order and spaced with each other. The first wiring layer 121 and the fourth wiring layer 124 are respectively located on opposite sides of the dielectric layer 120. The second wiring layer 122 and the third wiring layer 123 are embedded in the dielectric layer 120. The multilayer circuit board 10 may further include two solder masks respectively formed on a side of the first wiring layer 121 facing away from the fourth wiring layer 124 and a side of the fourth wiring layer 124 facing away from the first wiring layer 121.

The second wiring layer 122 includes the metal portion 103. The third wiring layer 123 may include a first gap 116 corresponding to the metal portion 103. The fourth wiring 124 may include a second gap 156 corresponding to the metal portion 103. The solder mask on the side of the fourth wiring layer 124 facing away from the first wiring layer 121 may include a third gap 183 corresponding to the metal portion 103.

The opening 101a is recessed from a portion of the dielectric layer 120 exposed from the third gap 183 and the second gap 156 toward the second wiring layer 122 to expose the metal portion 103.

In the method for manufacturing the package circuit structure and the package circuit structure of the present disclosure, the opening is formed to receive the electronic component, thereby reducing an overall thickness of the package circuit structure. The bottom of the opening is sealed by the metal portion, which is beneficial to improve the bearing strength and facilitate the installation of the electronic component when the electronic component is installed.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a package circuit structure comprising:
   providing a multilayer circuit board comprising an opening area extending from a first side of the multilayer circuit board to a second side of the multilayer circuit board facing away from the first side along a thickness direction, and a metal portion corresponding to a bottom of the opening area to support the opening area, wherein the multilayer circuit board is manufacturing by the following steps:
      providing a core board comprising a first metal foil, an inner dielectric layer, and a second metal foil stacked in that order along a thickness direction;
      forming an inner circuit board by performing a circuit manufacturing technology on the core board, wherein the first metal foil correspondingly forms a first inner wiring layer, the second metal foil correspondingly forms a second inner wiring layer, the first inner wiring layer is electrically connected to the second inner wiring layer, the first inner wiring layer comprises a metal portion;
      forming a first outer circuit board on the first inner wiring layer, and forming a second outer circuit board on the second inner wiring layer, wherein the first outer circuit board comprises a first outer dielectric layer combined with the first inner wiring layer and a first outer wiring layer formed on a side of the first outer dielectric layer facing away from the inner circuit board, the second outer circuit board comprises a second outer dielectric layer combined with the second inner wiring layer and a second outer wiring layer formed on a side of the second outer dielectric layer facing away from the inner circuit board, the second outer wiring layer comprises a second gap corresponding to the metal portion; and
      forming a solder mask on each of a side of the first outer circuit board facing away from the inner circuit board and a side of the second outer circuit board facing away from the inner circuit board;
   removing the opening area to form an opening, wherein a bottom of the opening is sealed by the metal portion;
   installing an electronic component in the opening, wherein the electronic component is carried by the metal portion and electrically connected to the multilayer circuit board; and
   packaging the electronic component.

2. The method of claim 1, wherein before removing the opening area to form the opening, further comprising:
   forming a protective film on each of the first side of the multilayer circuit board and the second side of the multilayer circuit board, wherein the opening area is exposed from the protective film on the first side of the multilayer circuit board;
   after removing the opening area to form the opening, further comprising:
   removing the protective films.

3. The method of claim 1, wherein no wiring is provided in the opening area, the multilayer circuit board further comprises two solder masks on opposite sides of the multilayer circuit board along the thickness direction respectively, the opening area is exposed from the solder mask on the first side.

4. The method of claim 1, wherein the second inner wiring layer comprises a first gap corresponding to the metal portion.

5. The method of claim 4, wherein a size of the first gap is greater than a size of the metal portion.

6. The method of claim 1, wherein a size of the second gap is greater than a size of the metal portion.

7. The method of claim 1, wherein the solder mask on the side of the second outer circuit board facing away from the inner circuit board comprises a third gap corresponding to the metal portion.

8. The method of claim 7, wherein a size of the third gap is greater than a size of the metal portion.

9. The method of claim 1, wherein a width of the opening decreases from the first side of the multilayer circuit board toward the second side of the multilayer circuit board.

10. The method of claim 1, wherein packaging the electronic component further comprising:
    forming an insulating layer on the first side of the multilayer circuit board, wherein the insulating fills the opening and covers the electronic component.

11. The method of claim 10, wherein the insulating layer is formed by injection molding.

* * * * *